United States Patent
Ha et al.

(10) Patent No.: US 9,997,462 B2
(45) Date of Patent: Jun. 12, 2018

(54) SEMICONDUCTOR MEMORY DEVICES

(71) Applicants: Jooyeon Ha, Hwaseong-si (KR); Jeonggil Lee, Hwaseong-si (KR); Dohyung Kim, Seongnam-si (KR); Keun Lee, Cheongju-si (KR); HyunSeok Lim, Suwon-si (KR); Hauk Han, Hwaseong-si (KR)

(72) Inventors: Jooyeon Ha, Hwaseong-si (KR); Jeonggil Lee, Hwaseong-si (KR); Dohyung Kim, Seongnam-si (KR); Keun Lee, Cheongju-si (KR); HyunSeok Lim, Suwon-si (KR); Hauk Han, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days. days.

(21) Appl. No.: 15/581,782

(22) Filed: Apr. 28, 2017

(65) Prior Publication Data
US 2018/0122742 A1    May 3, 2018

(30) Foreign Application Priority Data

Oct. 28, 2016    (KR) .................. 10-2016-0142035

(51) Int. Cl.
*H01L 27/115* (2017.01)
*H01L 23/535* (2006.01)
(Continued)

(52) U.S. Cl.
CPC ...... *H01L 23/535* (2013.01); *H01L 23/53266* (2013.01); *H01L 27/1157* (2013.01); *H01L 27/11565* (2013.01); *H01L 27/11568* (2013.01); *H01L 27/11578* (2013.01); *H01L 27/11582* (2013.01); *H01L 29/7889* (2013.01); *H01L 29/7926* (2013.01)

(58) Field of Classification Search
None
See application file for complete search history.

(56) References Cited

U.S. PATENT DOCUMENTS

| 8,513,729 B2 | 8/2013 | Choe et al. |
| 8,951,865 B2 | 2/2015 | Goda |

(Continued)

FOREIGN PATENT DOCUMENTS

| JP | 2008-85205 A | 4/2008 |
| KR | 10-2015-0126788 A | 11/2015 |
| KR | 10-1622036 B1 | 5/2016 |

*Primary Examiner* — Minh-Loan Tran
(74) *Attorney, Agent, or Firm* — Myers Bigel, P.A.

(57) ABSTRACT

A memory device includes a vertical string of nonvolatile memory cells on a substrate, along with a ground selection transistor extending between the vertical string of nonvolatile memory cells and the substrate. The ground selection transistor can have a current carrying terminal electrically coupled to a channel region of a nonvolatile memory cell in the vertical string of nonvolatile memory cells. The ground selection transistor includes a gate electrode associated with a ground selection line of the memory device. This gate electrode includes: (i) a mask pattern, (ii) a barrier metal layer of a first material extending opposite a sidewall of the mask pattern and (iii) a metal pattern of a second material different from the first material extending between at least a portion of the barrier metal layer and the mask pattern.

20 Claims, 15 Drawing Sheets

(51) Int. Cl.
*H01L 27/1157* (2017.01)
*H01L 27/11582* (2017.01)
*H01L 23/532* (2006.01)
*H01L 27/11565* (2017.01)
*H01L 27/11568* (2017.01)
*H01L 29/792* (2006.01)
*H01L 29/788* (2006.01)
*H01L 27/11578* (2017.01)

(56) References Cited

U.S. PATENT DOCUMENTS

| | | |
|---|---|---|
| 8,994,091 B2 | 3/2015 | Lee et al. |
| 9,076,879 B2 | 7/2015 | Yoo et al. |
| 9,466,669 B2 | 10/2016 | Rodder et al. |
| 2016/0148947 A1* | 5/2016 | Seo .................. H01L 27/11582 257/324 |
| 2017/0125540 A1* | 5/2017 | Park ..................... H01L 29/513 |

* cited by examiner

SEMICONDUCTOR MEMORY DEVICES

REFERENCE TO RELATED APPLICATION

This U.S. nonprovisional patent application claims priority under 35 U.S.C § 119 to Korean Patent Application 10-2016-0142035, filed Oct. 28, 2016, the entire contents of which are hereby incorporated herein by reference.

BACKGROUND

The present inventive concept relates to semiconductor devices and, more particularly, to semiconductor memory devices having enhanced reliability.

Semiconductor devices have been highly integrated for satisfying high performance and low manufacture costs of semiconductor devices, which are required by users. Since integration of the semiconductor devices is an important factor in determining product price, high integrated semiconductor devices are increasingly demanded. Integration of typical two-dimensional or planar semiconductor devices is primarily determined by the area occupied by a unit memory cell, such that it is greatly influenced by the level of technology for forming fine patterns. However, the extremely expensive processing equipment needed to increase pattern fineness may set a practical limitation on increasing the integration of the two-dimensional or planar semiconductor devices.

To overcome such limitations, three-dimensional semiconductor devices having three-dimensionally arranged memory cells have been proposed. However, in order to mass produce three-dimensional semiconductor memory devices, new process technologies should be developed in such a manner that can provide a lower manufacture cost per bit than two-dimensional semiconductor devices while maintaining or exceeding their level of reliability.

SUMMARY

Embodiments of the present invention provide semiconductor memory devices having enhanced reliability.

According to some embodiments of the invention, a memory device may include a vertical string of nonvolatile memory cells on a substrate, along with a ground selection transistor extending between the vertical string of nonvolatile memory cells and the substrate. The ground selection transistor can have a current carrying terminal electrically coupled to a channel region of a nonvolatile memory cell in the vertical string of nonvolatile memory cells. The ground selection transistor includes a gate electrode associated with a ground selection line of the memory device. This gate electrode includes: (i) a mask pattern, (ii) a barrier metal layer of a first material extending opposite a sidewall of the mask pattern and (iii) a metal pattern of a second material different from the first material extending between at least a portion of the barrier metal layer and the mask pattern. According to some of these embodiments of the invention, the gate electrode of the ground selection transistor is an insulated gate electrode and the mask pattern may include a third material different from the second material, such as an electrically insulating material. Alternatively, the mask pattern may be an electrically conductive material selected from a group consisting of WN, TaN, TiSiN, Co, Ni, Ti, Ta, $WSi_x$ and $TiSi_x$, the barrier metal layer may be a metal nitride layer and the metal pattern may be a tungsten (W) pattern. According to further embodiments of the invention, the barrier metal layer may wrap around a sidewall of the metal pattern and extend onto top and bottom surfaces of the metal pattern. And, the metal pattern may wrap around a sidewall of the mask pattern and extend onto top and bottom surfaces of the mask pattern, which may be an electrically insulating material.

According to further embodiments of the present inventive concept, a semiconductor memory device may comprise: a stack structure on a substrate, the stack structure including a ground select line and word lines stacked the ground select line; and a vertical channel on the substrate and penetrating the stack structure. The ground select line may comprise: a first mask pattern; a first barrier pattern extending onto top and bottom surfaces of the first mask pattern from between the vertical channel and the first mask pattern; and a first metal pattern between the first mask pattern and the first barrier pattern.

According to still further embodiments of the present inventive concept, a semiconductor memory device may comprise: a stack structure on a substrate, the stack structure including a ground select line and word lines stacked the ground select line; and a vertical channel on the substrate and penetrating the stack structure. The ground select line may comprise: a mask pattern; and a first metal pattern extending onto top and bottom surfaces of the mask pattern from between the vertical channel and the mask pattern. Each of the word lines may comprise: a second metal pattern; and a barrier pattern extending onto top and bottom surfaces of the second metal pattern from between the vertical channel and the second metal pattern. The first and second metal patterns may have the same material.

DETAILED DESCRIPTION OF EMBODIMENTS

Figure 1:
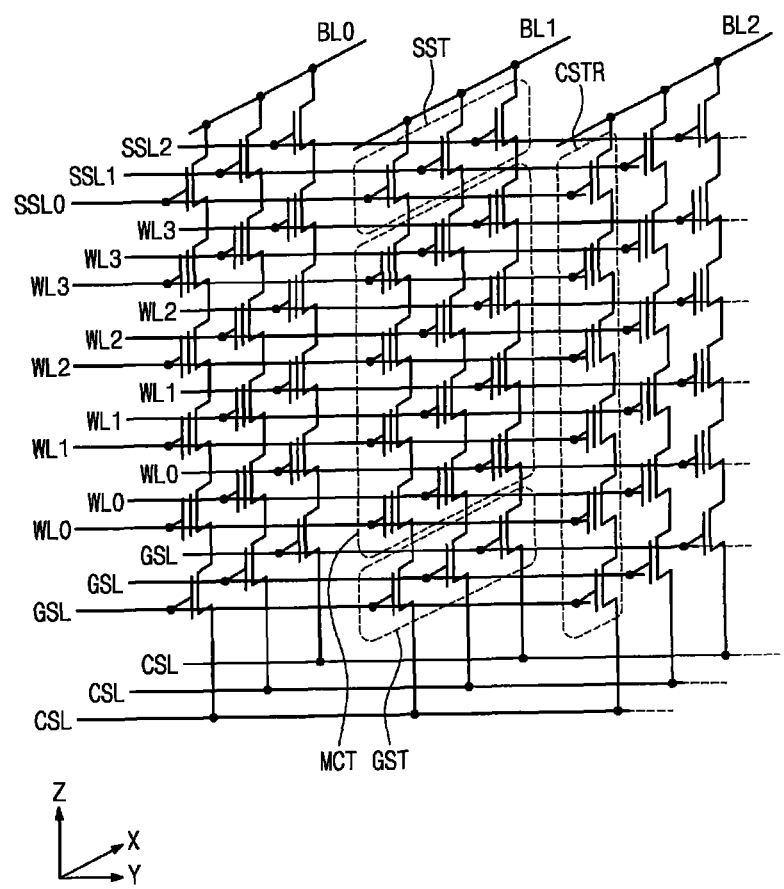
FIG. 1 is a simplified circuit diagram illustrating a cell array of a semiconductor memory device according to exemplary embodiments of the present inventive concept.

FIG. 1 is a simplified circuit diagram illustrating a cell array of a semiconductor memory device according to exemplary embodiments of the present inventive concept.

Referring to FIG. 1, a semiconductor memory device may include a common source line CSL, a plurality of bit lines BL0 to BL2, and a plurality of cell strings CSTR disposed between the common source line CSL and the bit lines BL0 to BL2.

The common source line CSL may be a conductive thin layer disposed on a semiconductor substrate or an impurity region formed in the semiconductor substrate. The bit lines BL0 to BL2 may be conductive patterns (e.g., metal lines) disposed above and spaced apart from the semiconductor substrate. The bit lines BL0 to BL2 may be two-dimensionally arranged, and a plurality of cell strings CSTR may be connected in parallel to each of the bit lines BL0 to BL2. Thus, the cell strings CSTR may be two-dimensionally arranged on either the common source line CSL or the semiconductor substrate.

Each of the cell strings CSTR may include a ground select transistor GST connected to the common source line CSL, a string select transistor SST connected to one of the bit lines BL0 to BL2, and a plurality of memory cell transistors MCT disposed between the ground and string select transistors GST and SST. The ground select transistor GST, the string select transistor SST, and the memory cell transistors MCT may be connected in series. In addition, a ground select line GSL, a plurality of word lines WL0 to WL3, and a plurality of string select lines SSL0 to SSL2 disposed between the common source line CSL and the bit lines BL0 to BL2 may be respectively used as gate electrodes of the ground select transistor GST, the memory cell transistors MCT, and the string select transistor SST.

The ground select transistors GST may be disposed at substantially the same distance from the semiconductor substrate, and the gate electrodes thereof may be commonly connected to the ground select line GSL to have the same electrical potential state. The ground select line GSL may be disposed between the common source line CSL and its most adjacent memory cell transistor MCT. Similarly, the gate electrodes of the plurality of memory cell transistors MCT, which are located at substantially the same distance from the common source line CSL, may also be commonly connected to one of the word lines WL0 to WL3 to have the same electrical potential state. In contrast, as one cell string CSTR includes a plurality of memory cell transistors MCT disposed at different distances from the common source line CSL, the word lines WL0 to WL3 may be disposed to have a multi-layered structure between the common source line CSL and the bit lines BL0 to BL2.

The ground and string select transistors GST and SST and the memory cell transistors MCT may be a MOS field effect transistor (MOSFET) using a channel structure as a channel region.

Figure 2:
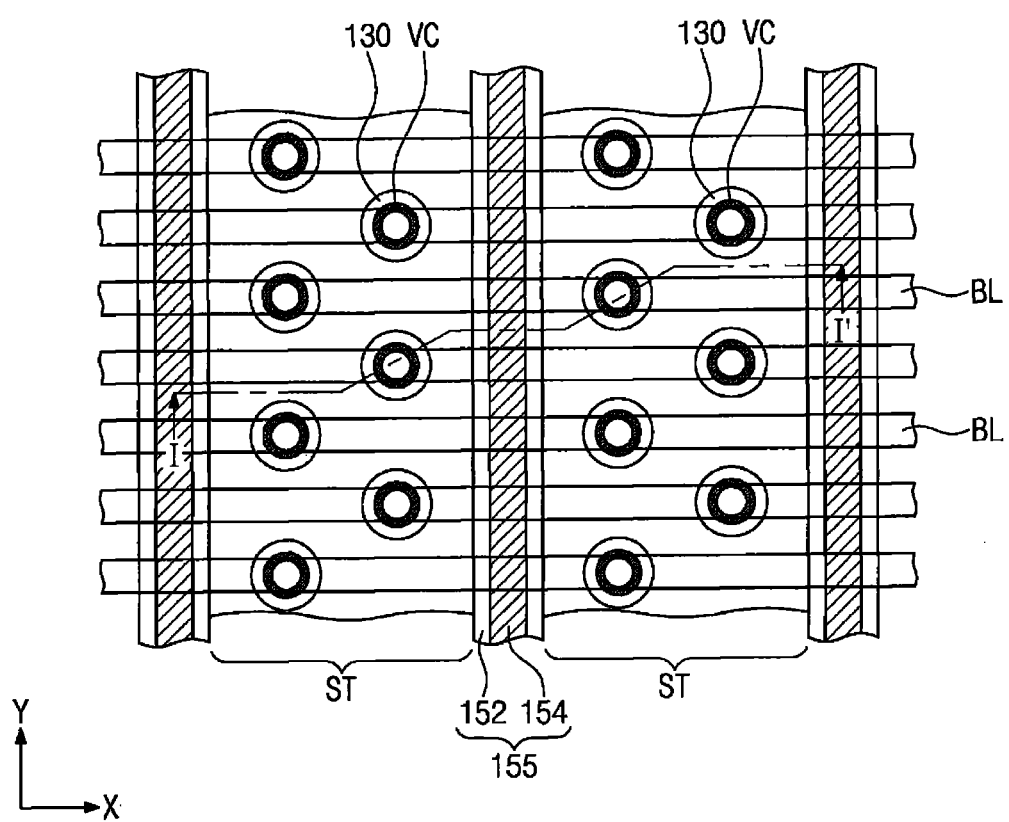
FIG. 2 is a plan view illustrating a semiconductor memory device according to exemplary embodiments of the present inventive concept.
Figure 3:
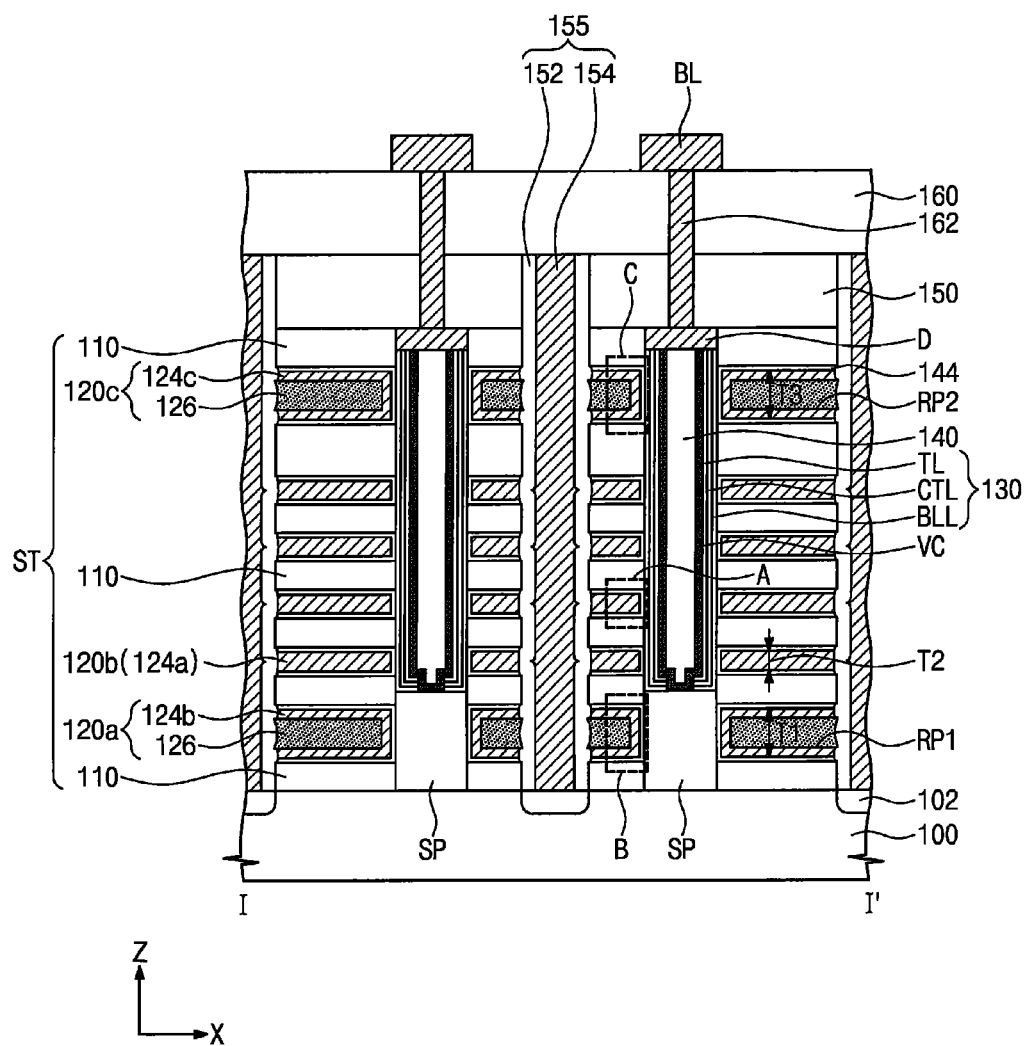
FIG. 3 is a cross-sectional view taken along line I-I' of FIG. 2 illustrating a semiconductor memory device according to exemplary embodiments of the present inventive concept.
Figure 4A:
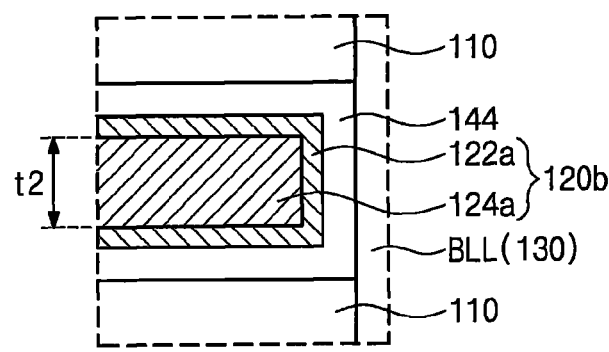
FIG. 4A is an enlarged view of section A shown in FIG. 3.
Figure 4B:
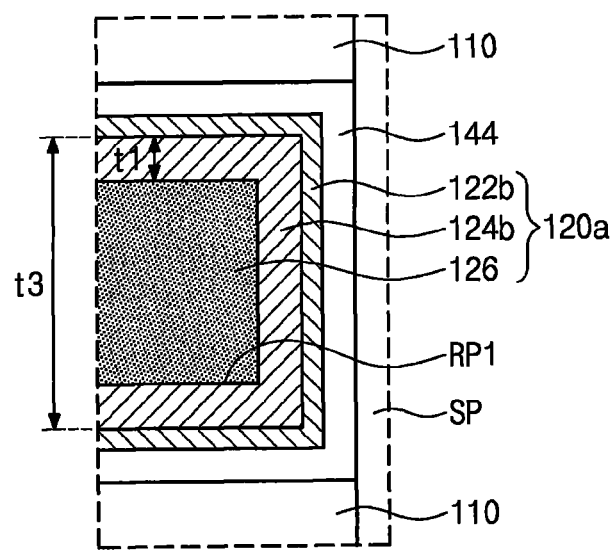
FIG. 4B is an enlarged view of portion B shown in FIG. 3.
Figure 4C:
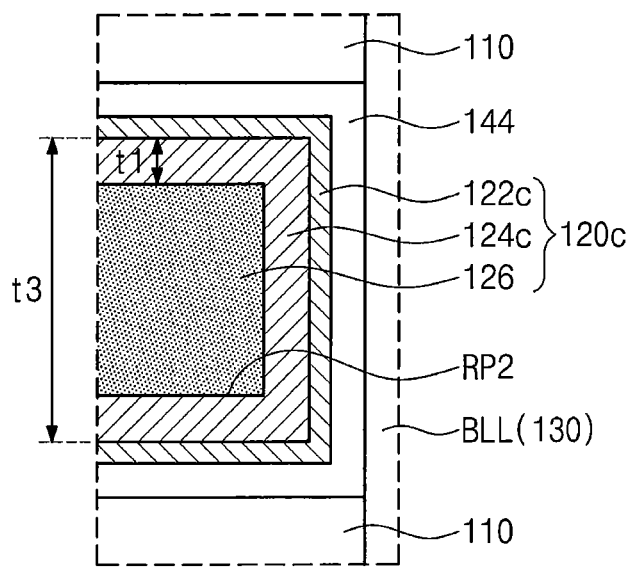
FIG. 4C is an enlarged view of portion C shown in FIG. 3.

FIG. 2 is a plan view illustrating a semiconductor memory device according to exemplary embodiments of the present inventive concept. FIG. 3 is a cross-sectional view taken along line I-I' of FIG. 2 illustrating a semiconductor memory device according to exemplary embodiments of the present inventive concept. FIG. 4A is an enlarged view of section A shown in FIG. 3. FIG. 4B is an enlarged view of portion B shown in FIG. 3. FIG. 4C is an enlarged view of portion C shown in FIG. 3.

Referring to FIGS. 2 and 3, a plurality of stack structures ST may be disposed on a substrate 100. The stack structures ST may be disposed spaced apart from the substrate 100 in a first direction X. The substrate 100 may be a silicon substrate, a silicon-germanium substrate, a germanium substrate, or a single crystalline epitaxial layer grown on a single crystalline silicon substrate.

An impurity region 102 may be disposed in the substrate 100 between the stack structures ST. The impurity region 102 may extend in a second direction Y crossing the first direction X. The impurity region 102 may be a common source line. In this case, the impurity region 102 may have conductivity different from that of the substrate 100.

Each of the stack structures ST may include insulation patterns 110 and gate electrodes 120a, 120b, and 120c that are alternately and repeatedly stacked on the substrate 100. The insulation patterns 110 may be stacked on the substrate 100 in a third direction Z perpendicular to a top surface of the substrate 100. The insulation patterns 110 may include, for example, a silicon oxide layer.

Each of the gate electrodes 120a, 120b, and 120c may be disposed between the insulation patterns 110. The gate electrodes 120a, 120b, and 120c may include a ground select gate electrode 120a, a string select gate electrode 120c, and cell gate electrodes 120b between the ground and string select gate electrodes 120a and 120c. The ground select gate electrode 120a may be a lowermost gate electrode, and the string select gate electrode 120c may be an uppermost gate electrode. The ground select gate electrode 120a may be the ground select line GSL of FIG. 1, the cell gate electrodes 120b may be the word lines WL0 to WL3 of FIG. 1, and the string select gate electrode 120c may be the string select line SSL of FIG. 1.

The gate electrodes 120a, 120b, and 120c may have outer sidewalls recessed toward a vertical channel VC and a semiconductor pillar SP from outer sidewalls of the insulation patterns 110. The ground select gate electrode 120a may have a minimum vertical thickness T1 greater than that T2 of each of the cell gate electrodes 120b. The minimum thickness T1 of the ground select gate electrode 120a may be substantially the same as that T3 of the string select gate electrode 120c. In an embodiment, the ground select gate electrode 120a may have a threshold voltage greater than that of each of the cell gate electrodes 120b. In an embodiment, the string select gate electrode 120c may have a threshold voltage greater than that of each of the cell gate electrodes 120b. When the ground select gate electrode 120a and/or the string select gate electrode 120c have a large threshold voltage, ground and string select transistors may have an increased channel length such that a memory cell string may possibly have increased current and exhibit improved current controllability.

A description of structural features of the gate electrodes 120a, 120b, and 120c will be provided after a description of the semiconductor pillar SP.

A plurality of the vertical channels VC may penetrate each of the stack structures ST. As shown in FIG. 2, the vertical channels VC may be arranged linearly or zigzag in the first direction X. Each of the vertical channels VC may include a semiconductor material. For example, the vertical channel VC may be one of a polycrystalline silicon layer, an organic semiconductor layer, and carbon nanostructures.

A charge storage structure 130 may be disposed between the vertical channel VC and each of the stack structures ST. The charge storage structure 130 may be disposed between the cell gate electrodes 120b and the vertical channel VC and between the string select gate electrode 120c and the vertical channel VC. The charge storage structure 130 may extend in the third direction Z along an outer sidewall of the vertical channel VC. The charge storage structure 130 may have a shape that surrounds the outer sidewall of the vertical channel VC.

The charge storage structure 130 may include a tunnel insulation layer TL, a blocking insulation layer BLL, and a charge storage layer CTL. The tunnel insulation layer TL may be disposed adjacent to the vertical channel VC. The blocking insulation layer BLL may be disposed adjacent to the cell gate electrodes 120b and the string select gate electrode 120c. The charge storage layer CTL may be disposed between the tunnel insulation layer TL and the blocking insulation layer BLL. The charge storage structure 130 may include a single layer or a plurality of layers including at least one of, for example, a silicon oxide layer, a silicon nitride layer, a silicon oxynitride layer, or a high-k dielectric layer. In detail, the tunnel insulation layer TL may include a silicon oxide layer or a high-k dielectric layer (e.g., aluminum oxide ($Al_2O_3$) or hafnium oxide ($HfO_2$)), the charge storage layer CTL may include a silicon nitride layer, and the blocking insulation layer BLL may include a silicon oxide layer or a high-k dielectric layer (e.g., aluminum oxide ($Al_2O_3$) or hafnium oxide ($HfO_2$)).

A gap-fill layer 140 may be disposed in an inner space surrounded by the vertical channel VC. The gap-fill layer 140 may include an insulating material, for example, a silicon oxide layer, a silicon nitride layer, or a silicon oxynitride layer. A pad D may be disposed at upper portions of the vertical channel VC, the charge storage structure 130, and the gap-fill layer 140. The pad D may be electrically connected to the vertical channel VC. The pad D may include a conductive material or a semiconductor material doped with impurities having conductivity different from that of the vertical channel VC.

The semiconductor pillar SP may be disposed between the vertical channel VC and the substrate 100. The semiconductor pillar SP may be disposed on the top surface of the substrate 100 and penetrate the ground select gate electrode 120a. The vertical channel VC and the semiconductor pillar SP may be electrically connected to each other. The semiconductor pillar SP may be either an intrinsic semiconductor or a semiconductor having the same conductivity as that of the substrate 100. For example, the semiconductor pillar SP may be either a single crystalline intrinsic semiconductor or a p-type conductive semiconductor.

It will be described hereinafter structural features of the gate electrodes 120a, 120b, and 120c with reference to FIGS. 4A to 4C.

As shown in FIG. 4A, each of the cell gate electrodes 120b may include a barrier pattern 122a and a metal pattern 124a. The metal pattern 124a may be disposed between the insulation patterns 110 disposed spaced apart in the third direction Z. The metal pattern 124a may include a metallic material (e.g., tungsten). The barrier pattern 122a may extend onto top and bottom surfaces of the metal pattern 124a from between the metal pattern 124a and the charge storage structure 130. The barrier pattern 122a may prevent metal ions of the metal pattern 124a from being diffused into the charge storage structure 130. The barrier pattern 122a may include, for example, a metal nitride layer such as TiN, TaN, or WN.

As shown in FIG. 4B, the ground select gate electrode 120a may include a mask pattern 126, a barrier pattern 122b, and a metal pattern 124b. The mask pattern 126 of the ground select gate electrode 120a may be disposed between the insulation patterns 110 disposed spaced apart in the third direction Z. The mask pattern 126 may have an outer sidewall exposed through the metal pattern 124b and the barrier pattern 122b, and the exposed outer sidewall may be concave. The barrier pattern 122b may extend onto top and bottom surfaces of the mask pattern 126 from between the mask pattern 126 and the semiconductor pillar SP. The metal pattern 124b may extend onto the top and bottom surfaces of the mask pattern 126 from between the mask pattern 126 and the barrier pattern 122b. For example, the metal pattern 124b may have a recession RP1 recessed toward the semiconductor pillar SP. The mask pattern 126 may be disposed in the recession RP1.

As shown in FIG. 4C, the string select gate electrode 120c may include a mask patterns 126, a barrier pattern 122c, and a metal pattern 124c. The mask pattern 126 of the string select gate electrode 120c may be disposed between the insulation patterns 110 disposed spaced apart in the third direction Z. The mask pattern 126 may have an outer sidewall exposed through the metal pattern 124c and the barrier pattern 122c, and the exposed outer sidewall may be concave. The barrier pattern 122c may extend onto top and bottom surfaces of the mask pattern 126 from between the charge storage structure 130 and the mask pattern 126 of the string select gate electrode 120c. The metal pattern 124c may extend onto the top and bottom surfaces of the mask pattern 126 from between the mask pattern 126 and the barrier pattern 122c. The metal pattern 124c may have a recession RP2 recessed toward the vertical channel VC. The mask pattern 126 may be disposed in the recession RP2.

The mask patterns 126 may include a material having an etch selectivity to the metal patterns 124b and 124c. The mask patterns 126 may include a conductive material or an insulating material. The conductive material may include, for example, WN, TaN, TiSiN, Co, Ni, Ti, Ta, $WSi_x$, or $TiSi_x$. The insulating material may include, for example, SiN, $SiO_2$, AlO, AlN, or $TiO_x$. The barrier patterns 122b and 122c may prevent metal ions of the metal patterns 124b and 124c from being diffused into the semiconductor pillar SP and/or the charge storage structure 130. The barrier patterns 122b and 122c may include, for example, a metal nitride layer such as TiN, TaN, or WN. The metal patterns 124b and 124c may include, for example, a metallic material (e.g., tungsten).

For example, a minimum vertical thickness t1 may be given to the metal patterns 124b and 124c respectively included in the ground and string select gate electrodes 120a and 120c. The minimum vertical thickness t1 may be half that t2 of the metal pattern 124a included in the cell gate electrode 120b. Alternatively, the minimum vertical thickness t1 of the metal patterns 124b and 124c respectively included in the ground and string select gate electrodes 120a and 120c may be greater than half that t2 of the metal pattern 124a included in the cell gate electrode 120b and less than half a maximum thickness t3 of the metal patterns 124b and 124c respectively included in the ground and string select gate electrodes 120a and 120c.

Horizontal insulation patterns 144 may be disposed between the semiconductor pillar SP and the ground select gate electrode 120a, between the charge storage structure 130 and each of the cell gate electrodes 120b, and between the charge storage structure 130 and the string select gate electrode 120c. The horizontal insulation pattern 144 between the semiconductor pillar SP and the ground select gate electrode 120a may extend onto top and bottom surfaces of the ground select gate electrode 120a. The horizontal insulation pattern 144 between the charge storage structure 130 and each of the cell gate electrodes 120b may extend onto top and bottom surfaces of each of the cell gate electrodes 120b. The horizontal insulation pattern 144 between the charge storage structure 130 and the string select gate electrode 120c may extend onto top and bottom surfaces of the string select gate electrode 120c. The horizontal insulation patterns 144 may be disposed spaced apart from each other in the third direction Z across the insulation patterns 110. The horizontal insulation patterns 144 may include, for example, a high-k dielectric layer (e.g., aluminum oxide ($Al_2O_3$) or hafnium oxide ($HfO_2$)).

Referring back to FIGS. 2 and 3, a first interlayer dielectric layer 150 may be disposed on the stack structures ST. The first interlayer dielectric layer 150 may cover top surfaces of the pad D and an uppermost insulation pattern 110. The first interlayer dielectric layer 150 may include, for example, a silicon oxide layer.

A contact structure 155 may be disposed between the stack structures ST. The contact structure 155 may penetrate the first interlayer dielectric layer 150 and be in contact with the substrate 100. As viewed in plan, the contact structure 155 may have a shape of rectangle or line extending in the second direction Y. Alternatively, the contact structure 155 may be provided in plural, which are arranged in the second direction Y along the impurity region 102. In this case, the plurality of contact structures 155 may have a pillar shape.

The contact structure 155 may include a spacer 152 and a common source contact 154. The common source contact 154 may be electrically connected to the impurity region 102. The common source contact 154 may include a metallic material (e.g., tungsten, copper, or aluminum) or a transition metal material (e.g., titanium or tantalum).

The spacer 152 may surround an outer sidewall of the common source contact 154 and be disposed between the common source contact 154 and the stack structure ST. The spacer 152 may electrically insulate the gate electrodes 120a, 120b, and 120c from the common source contact 154. For example, the spacer 152 may partially fill a space between the insulation patterns 110 adjacent to each other in the third direction Z. The spacer 152 may include, for example, an insulating material (e.g., a silicon oxide layer or a silicon nitride layer).

A second interlayer dielectric layer 160 may be disposed on the first interlayer dielectric layer 150 and the contact structure 155. The second interlayer dielectric layer 160 may include, for example, a silicon oxide layer.

A bit line contact plug 162 may be disposed on the pad D. The bit line contact plug 162 may penetrate the first and second interlayer dielectric layers 150 and 160 to electrically connect with the pad D and the vertical channel VC. The bit line contact plug 162 may include, for example, a conductive material (e.g., tungsten).

A bit line BL may be disposed on the bit line contact plug 162. The bit line BL may be electrically connected to the bit line contact plug 162. The bit line BL may be provided in plural, and the plurality of bit lines BL may extend in the first direction X to run across the stack structures ST. The plurality of bit lines BL may be arranged in the second direction Y.

Figure 5:
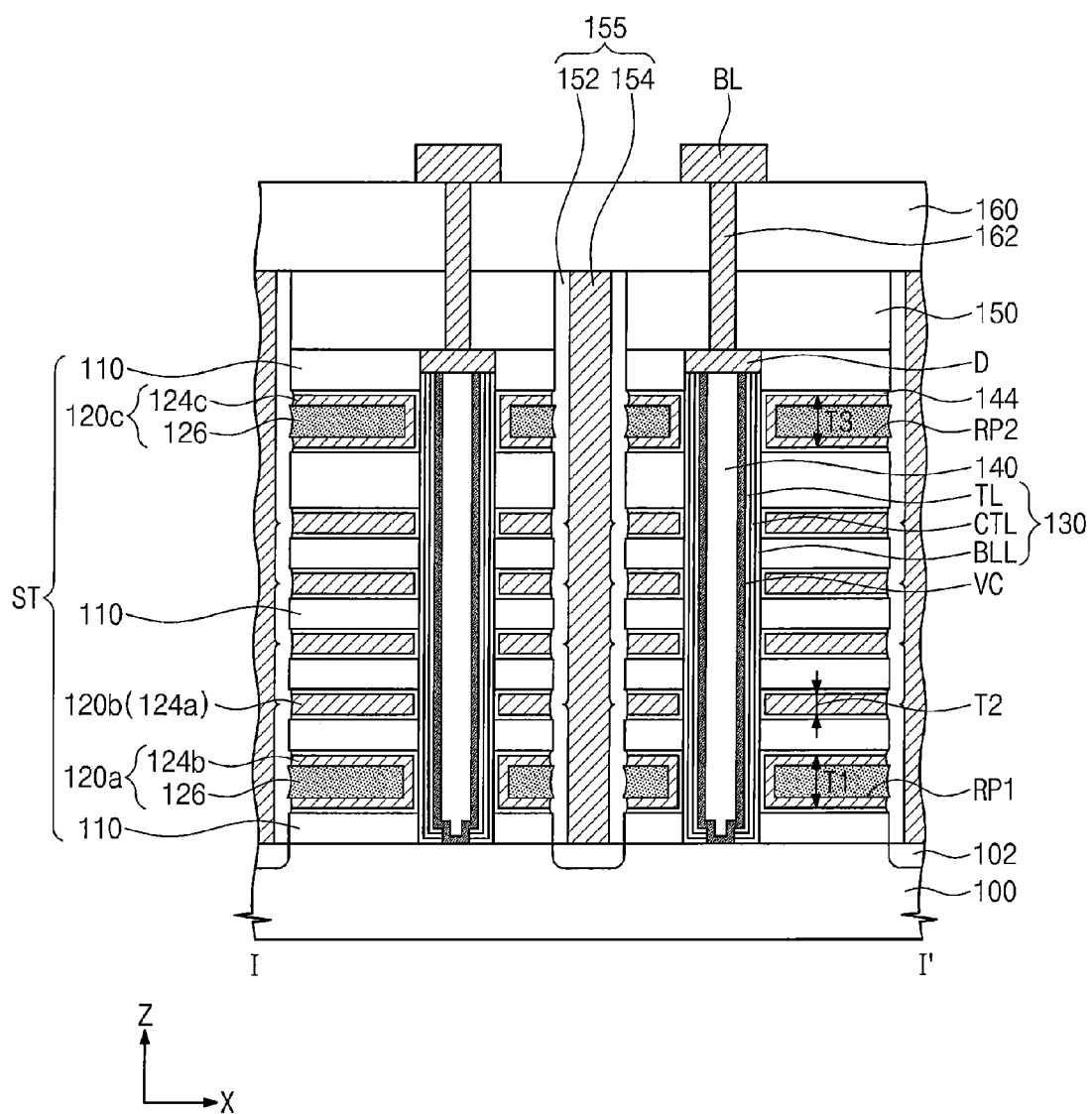
FIG. 5 is a cross-sectional view taken along line I-I' of FIG. 2 illustrating a semiconductor memory device according to exemplary embodiments of the present inventive concept.

FIG. 5 is a cross-sectional view taken along line I-I' of FIG. 2 illustrating a semiconductor memory device according to exemplary embodiments of the present inventive concept. For brevity of the description, components substantially the same as those of the semiconductor memory device discussed with reference to FIGS. 2 and 3 are allocated the same reference numerals thereto, and a repetitive explanation thereof will be omitted.

Referring to FIG. 5, the vertical channel VC and the charge storage structure 130 may penetrate the ground select gate electrode 120a and a lowermost insulation pattern 110 such that the substrate 100 may be in contact with the vertical channel VC and the charge storage structure 130. In other words, a semiconductor memory device of FIG. 5 may have no semiconductor pillar SP shown in FIG. 3. In this case, the metal pattern 124b may have the recession RP1 recessed toward the vertical channel VC. The mask pattern 126 may be disposed in the recession RP1. The barrier pattern 122b may extend onto top and bottom surfaces of the mask pattern 126 from between the mask pattern 126 and the charge storage structure 130. The metal pattern 124b may extend onto the top and bottom surfaces of the mask pattern 126 from between the mask pattern 126 and the barrier pattern 122b.

Figure 6:
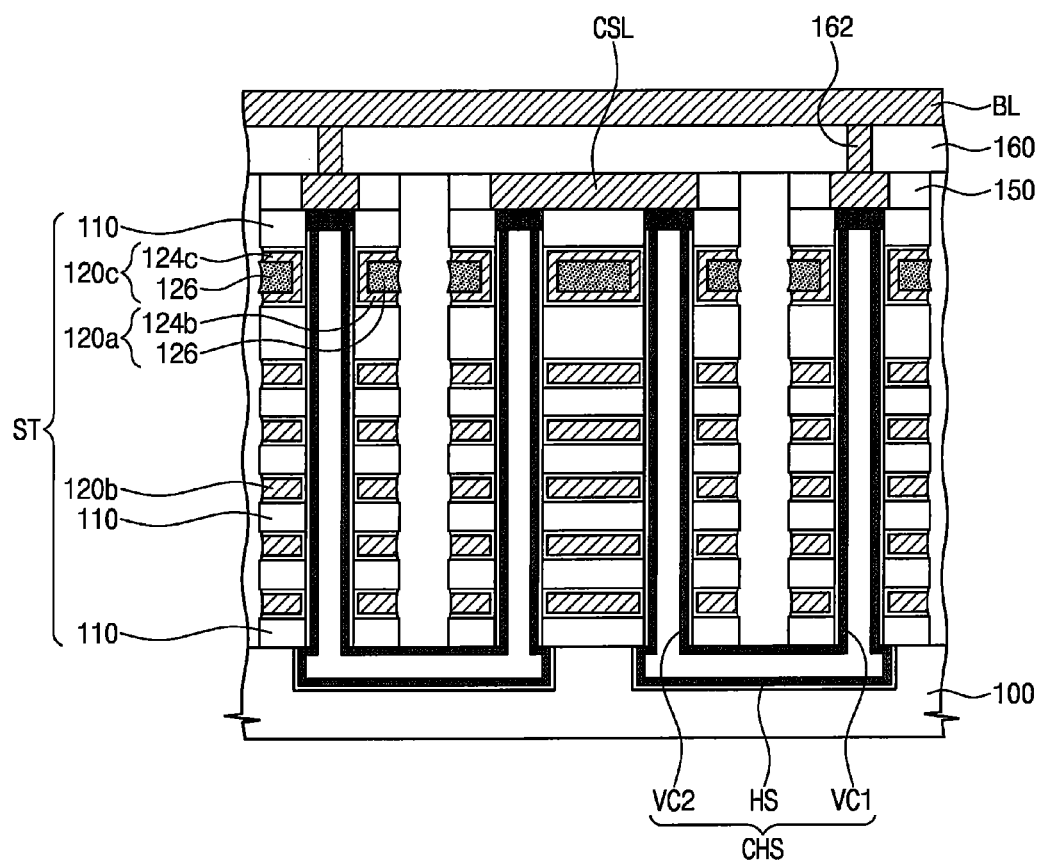
FIG. 6 is a cross-sectional view illustrating a semiconductor memory device according to exemplary embodiments of the present inventive concept.

FIG. 6 is a cross-sectional view illustrating a semiconductor memory device according to exemplary embodiments of the present inventive concept. For brevity of the description, components substantially the same as those of the semiconductor memory device discussed with reference to FIGS. 2 and 3 are allocated the same reference numerals thereto, and a repetitive explanation thereof will be omitted.

Referring to FIG. 6, the stack structure ST may be disposed on the substrate 100. The stack structure ST may include insulation patterns 110 and gate electrodes 120a, 120b, and 120c that are alternately and repeatedly stacked on the substrate 100. The gate electrodes 120a, 120b, and 120c may include the ground select gate electrode 120a, the cell gate electrodes 120b, and the string select gate electrode 120c. The ground select gate electrode 120a may be disposed between the common source line CSL and an uppermost cell gate electrode 120b. The string select gate electrode 120c may be disposed between the bit line BL and the uppermost cell gate electrode 120b. The ground select gate electrode 120a and the string select gate electrode 120c may be horizontally spaced apart from each other. The cell gate electrodes 120b may be disposed between the substrate 100 and the ground select gate electrode 120a and between the substrate 100 and the string select gate electrode 120c. The ground select gate electrode 120a and the string select gate electrode 120c may be disposed on the cell gate electrodes 120b.

As shown in FIG. 4A, each of the cell gate electrodes 120b may include the barrier pattern 122a and the metal pattern 124a. As shown in FIG. 4B, the ground select gate electrode 120a may include the mask pattern 126, the barrier pattern 122b, and the metal pattern 124b. Likewise, as shown in FIG. 4C, the string select gate electrode 120c may include the mask pattern 126, the barrier pattern 122c, and the metal pattern 124c. As the ground select gate electrode 120a, the cell gate electrodes 120b, and the string select gate electrode 120c are already described with reference to FIGS. 2 and 4A to 4C, a repetitive description thereof will be omitted herein.

Channel structures CHS may be provided to penetrate the stack structures ST. Each of the channel structures CHS may penetrate the insulation patterns 110 and the gate electrodes 120a, 120b, and 120c. Each of the channel structures CHS may include a first vertical channel VC1 penetrating the stack structure ST, a second vertical channel VC2 penetrating the stack structure ST, and a horizontal channel HS that connects the first and second vertical channels VC1 and VC2 below the stack structure ST. The first and second vertical channels VC1 and VC2 may be provided in vertical holes that penetrate the stack structure ST. The horizontal channel HS may be provided in a recess region formed at an upper portion of the substrate 100.

In an embodiment, the horizontal channel HS may have a hollow pipe or macaroni shape successively connected to the first and second vertical channels VC1 and VC2. In other words, the horizontal channel HS and the first and second vertical channels VC1 and VC2 may have a unitary pipe shape. For example, the horizontal channel HS and the first and second vertical channels VC1 and VC2 may be composed of a single semiconductor layer continuously extending without boundaries. In this case, the semiconductor layer may be composed of a semiconductor material including at least one selected from a single crystalline structure, an amorphous structure, and a polycrystalline structure. Charge storage structures may be interposed between the channel structures CHS and the gate electrodes 120*a*, 120*b*, and 120*c*.

In an embodiment, the first vertical channel VC1 of each channel structure CHS may be connected to the bit line BL, and the second vertical channel VC2 may be connected to the common source line CSL. The channel structures CHS may be electrically separated from each other.

FIGS. 7A to 7D and 7F to 7H are cross-sectional views taken along line I-I' of FIG. 2, illustrating a method of manufacturing a semiconductor memory device according to exemplary embodiments of the present inventive concept. FIG. 7E is an enlarged view of section E shown in FIG. 7D.

Figure 7A:
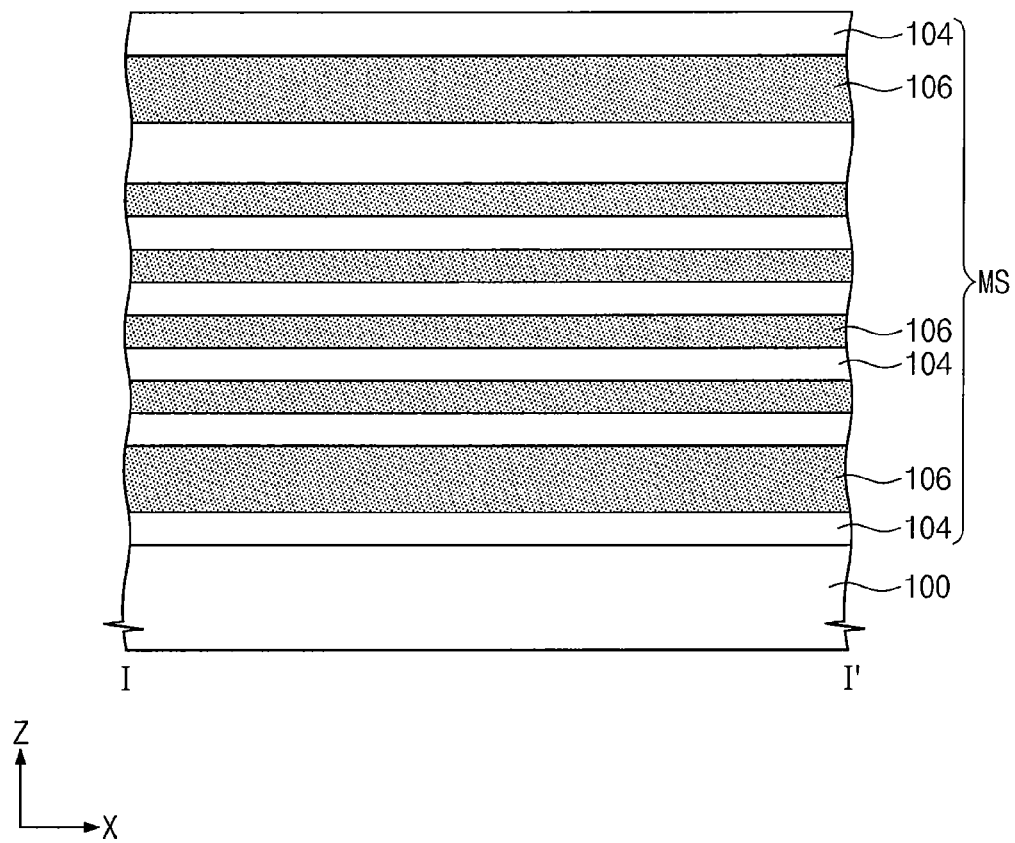
FIGS. 7A to 7D and 7F to 7H are cross-sectional views taken along line I-I' of FIG. 2, illustrating a method of manufacturing a semiconductor memory device according to exemplary embodiments of the present inventive concept.

Referring to FIG. 7A, a mold structure MS may be formed on a substrate 100. The substrate 100 may be a silicon substrate, a silicon-germanium substrate, a germanium substrate, or a single crystalline epitaxial layer grown on a single crystalline silicon substrate.

The mold structure MS may include insulation layers 104 and sacrificial layers 106 that are alternately and repeatedly stacked on the substrate 100. The insulation layers 104 may include a material having an etch selectivity different from that of the sacrificial layers 106. For example, the insulation layers 104 may include a silicon oxide layer, and the sacrificial layers 106 may include a silicon nitride layer or a silicon oxynitride layer. For example, lowermost and uppermost ones of the sacrificial layers 106 may have thicknesses greater than those of others of the sacrificial layers 106 between the lowermost and uppermost tones of the sacrificial layers 106. As not shown in figures, a buffer insulation layer (not shown) may be provided between the substrate 100 and the mold structure MS.

Figure 7B:
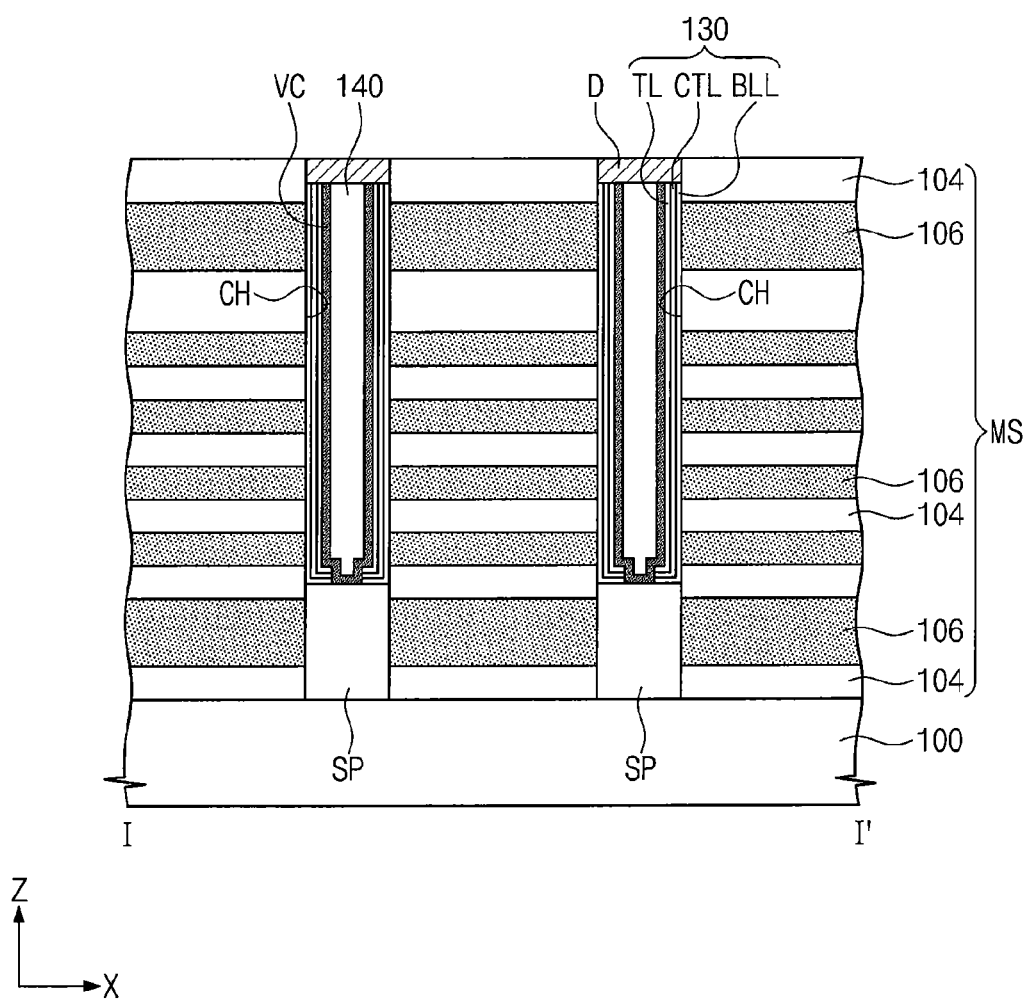

Referring to FIG. 7B, the mold structure MS may be patterned to form channel holes CH through which the substrate 100 is exposed. The channel holes CH may be formed by forming a mask pattern (not shown) on an uppermost insulation layer 104 and then anisotropically etching the mold structure MS using the mask pattern as an etching mask. The anisotropic etching process may form the channel holes CH each having the same width along its height from the substrate 100. Alternatively, the anisotropic etching process may form the channel holes CH each having a variable width along its height from the substrate 100. That is, the channel holes CH may have a sloped sidewall relative to the substrate 100. An over-etching action may be carried out such that the substrate 100 may also be etched to have a recessed top surface. As viewed in plan, the channel holes CH may have a shape of circle, ellipse or polygon.

A semiconductor pillar SP may be formed in each of the channel holes CH. A selective epitaxial growth may be performed to grow the semiconductor pillar SP from the substrate 100 of which portion exposed through the channel hole CH is used as a seed. The semiconductor pillar SP may include a material having the same conductivity as that of the substrate 100, for example, an intrinsic or p-type conductive semiconductor.

A charge storage structure 130 may be formed on a sidewall of each of the channel holes CH. The charge storage structure 130 may cover the sidewall of the channel hole CH and partially cover a top surface of the semiconductor pillar SP exposed through the channel hole CH. In detail, the formation of the charge storage structure 130 may include:

forming a blocking insulation layer BLL, a charge storage layer CTL, and a tunnel insulation layer TL sequentially covering the sidewall of the channel hole CH; and partially etching the blocking insulation layer BLL, the charge storage layer CTL, and the tunnel insulation layer TL to partially expose the top surface of the semiconductor pillar SP. The blocking insulation layer BLL may include, for example, a silicon oxide layer or a high-k dielectric layer (e.g., $Al_2O_3$, $HfO_2$). The charge storage layer CTL may include, for example, a silicon nitride layer. The tunnel insulation layer TL may include, for example, a silicon oxynitride layer or a high-k dielectric layer (e.g., $Al_2O_3$, $HfO_2$).

A vertical channel VC may be formed in the channel hole CH in which the charge storage structure 130 is formed. The vertical channel VC may conformally cover an inner sidewall of the charge storage structure 130 and the top surface of the semiconductor pillar SP exposed through the charge storage structure 130. The vertical channel VC may include, for example, a semiconductor material. For example, the vertical channel VC may be one of a polycrystalline silicon layer, an organic semiconductor layer, and carbon nano structures.

A gap-fill layer 140 may be formed in an inner space surrounded by the vertical channel VC. The gap-fill layer 140 may completely fill the channel hole CH. The gap-fill layer 140 may be formed using an SOG technique. The gap-fill layer 140 may include an insulating material, for example, one of a silicon oxide layer and a silicon nitride layer. Prior to the formation of the gap-fill layer 140, a hydrogen annealing process may be performed to heat treat the vertical channel VC under a gas atmosphere including hydrogen or deuterium. The hydrogen annealing process may cure crystalline defects present in the vertical channel VC.

A pad D may be formed at upper portions of the vertical channel VC, the charge storage structure 130, and the gap-fill layer 140. The pad D may be formed by etching upper portions of the charge storage structure 130, the vertical channel VC, and the gap-fill layer 140 to form a recess region and then filling the recess region with a conductive material. Alternatively, the pad D may be formed by doping an upper portion of the vertical channel portion VC with impurities having conductivity different from that the vertical channel VC.

Figure 7C:
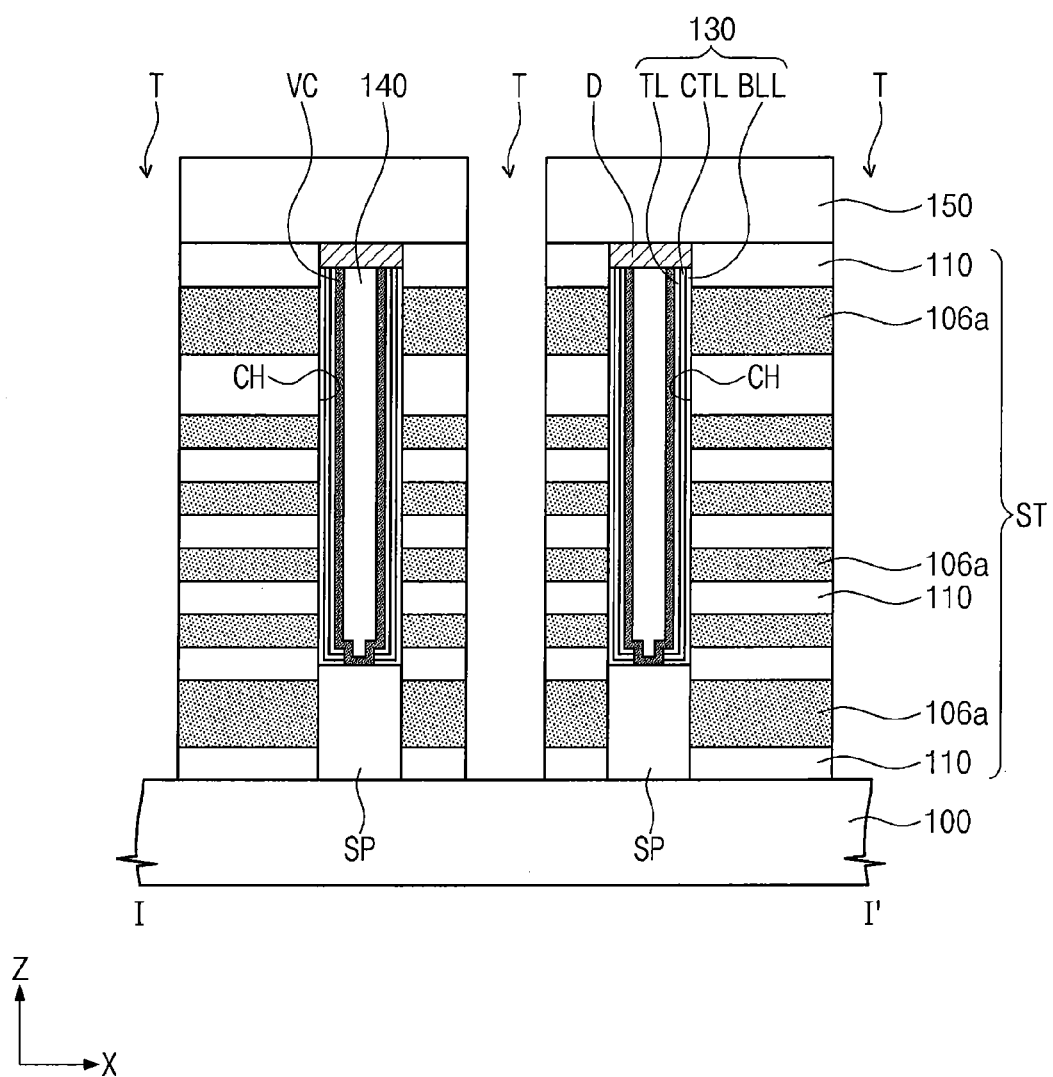

Referring to FIG. 7C, trenches T may be formed by performing an anisotropic etching process on the mold structure MS. The trenches T may be formed by forming a first interlayer dielectric layer 150 on the mold structure MS and anisotropically etching the mold structure MS using the first interlayer dielectric layer 150 as an etching mask until exposing the top surface of the substrate 100. The trenches T may be formed to extend in a second direction Y. The trenches T may then be formed to have a shape of line or rectangle extending in the second direction Y. As the trenches T are formed, a plurality of stack structures ST may be formed spaced apart from each other in a first direction X on the substrate 100.

Each of the stack structures ST may include insulation patterns 110 and sacrificial patterns 106*a* that are sequentially and alternately stacked on the substrate 100. The insulation patterns 110 may be formed by patterning the insulation layers 104, and the sacrificial patterns 106*a* may be formed by patterning the sacrificial layers 106. The trenches T may expose sidewalls of the insulation patterns 110 and also expose sidewalls of the sacrificial patterns 106*a*.

Figure 7D:
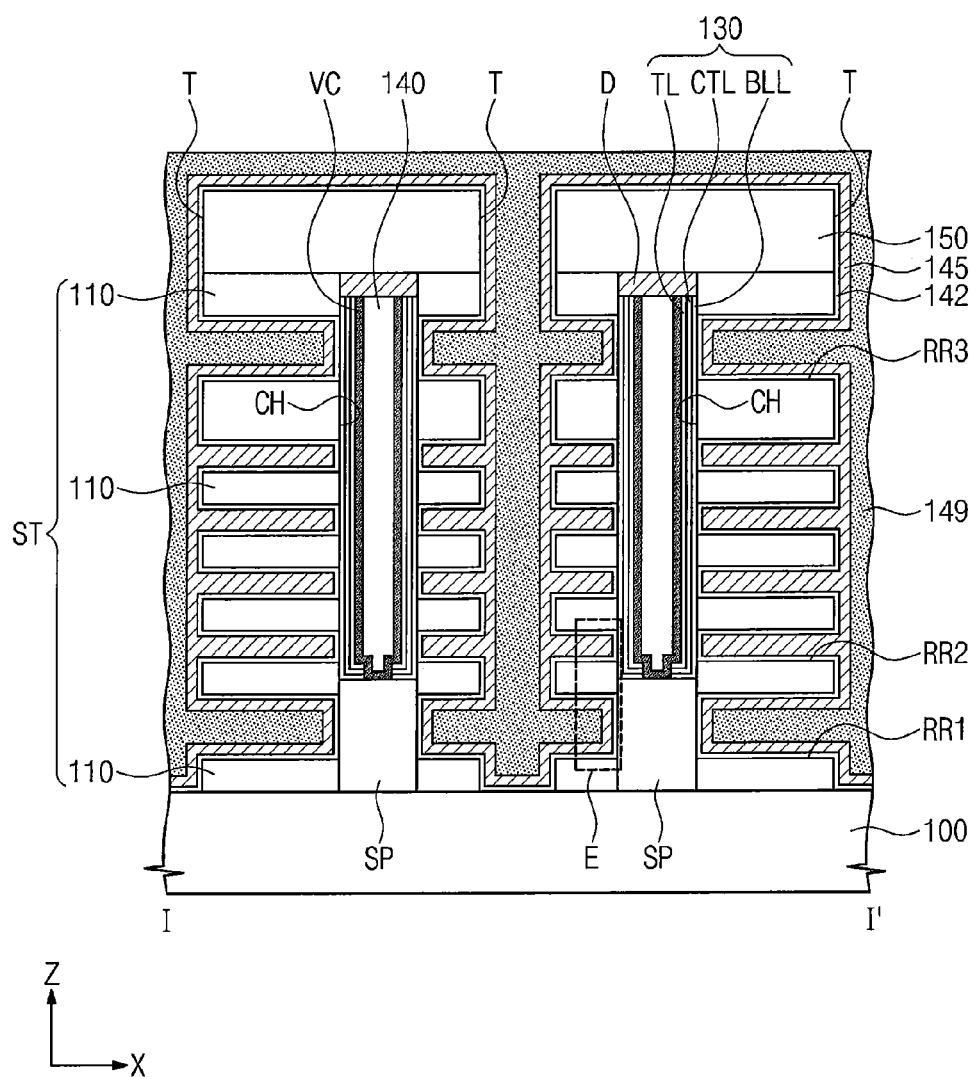
Figure 7E:
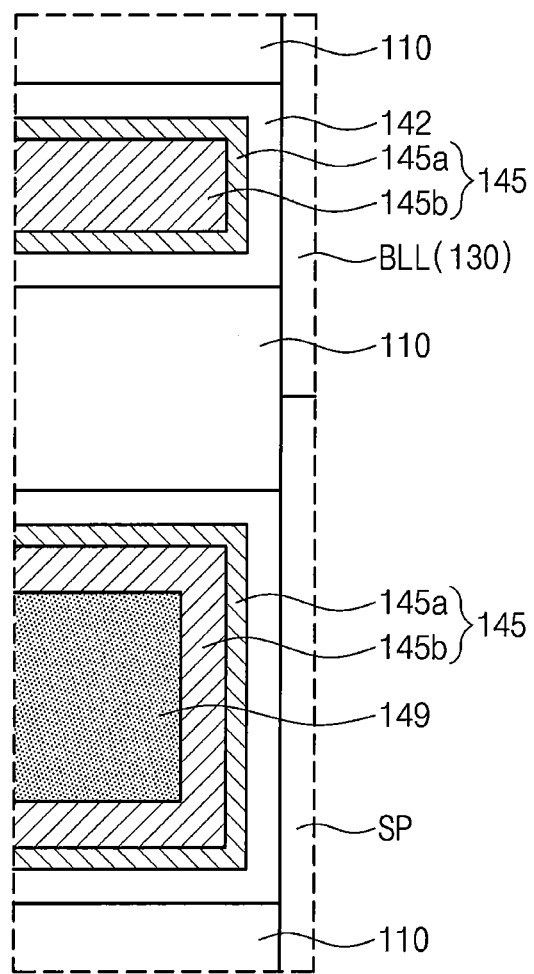
FIG. 7E is an enlarged view of section E shown in FIG. 7D.

Referring to FIG. 7D, recess regions RR1, RR2, and RR3 may be formed by removing the sacrificial patterns 106a exposed through the trenches T. The recess regions RR1, RR2, and RR3 may horizontally extend between the insulation patterns 110 from each of the trenches T. The recess regions RR1, RR2, and RR3 may expose top and bottom surfaces of the insulation patterns 110, a portion of an outer sidewall of the charge storage structure 130, and a portion of a sidewall of the semiconductor pillar SP. The sacrificial patterns 106a may be removed by a wet etching process and/or an isotropic dry etching process. As the sacrificial patterns 106a include a material having an etch selectivity to the insulation patterns 110, the insulation patterns 110 may not be removed when the sacrificial patterns 106a are removed. For example, when the sacrificial patterns 106a include a silicon nitride layer and the insulation patterns 110 include a silicon oxide layer, the etching process may be performed using an etchant including phosphoric acid.

The recess regions RR1, RR2, and RR3 may include a lowermost recess region RR1, an uppermost recess region RR3, and intermediate recess regions RR2. The lowermost recess region RR1 may be formed by removing a lowermost one of the sacrificial patterns 106a, the uppermost recess region RR3 may be formed by removing an uppermost one of the sacrificial patterns 106a, and the intermediate recess regions RR2 may be formed by removing others of the sacrificial patterns 106a between the lowermost and uppermost ones of the sacrificial patterns 106a.

A horizontal insulation layer 142 may be formed in the trenches T and the recess regions RR1, RR2, and RR3. For example, the horizontal insulation layer 142 may conformally cover surfaces of the insulation patterns 110, the sidewall of the semiconductor pillar SP exposed through the lowermost recess region RR1, the outer sidewall of the charge storage structure 130 exposed through the intermediate and uppermost recess regions RR2 and RR3, the top surface of the substrate 100, and a top surface of the first interlayer dielectric layer 150. The horizontal insulation layer 142 may be formed using a deposition process having a good step coverage. For example, the horizontal insulation layer 142 may be formed using a chemical vapor deposition (CVD) or an atomic layer deposition (ALD). The horizontal insulation layer 142 may include a silicon oxide layer (e.g., $SiO_2$) or a high-k dielectric layer (e.g., aluminum oxide ($Al_2O_3$), hafnium oxide ($HfO_2$)).

A gate electrode layer 145 may be formed to cover a surface of the horizontal insulation layer 142. The gate electrode layer 145 may completely fill the intermediate recess regions RR2. The gate electrode layer 145 may conformally cover the horizontal insulation layer 142 formed in the lowermost and uppermost recess regions RR1 and RR3. In an embodiment, the lowermost and uppermost recess regions RR1 and RR3 may have vertical widths greater than those of the intermediate recess regions RR2 such that the gate electrode layer 145 may not completely fill the lowermost and uppermost recess regions RR1 and RR3.

As shown in FIG. 7E, the gate electrode layer 145 may include a barrier layer 145a and a metal layer 145b. The barrier layer 145a may conformally cover the surface of the horizontal insulation layer 142. The barrier layer 145a may include, for example, a metal nitride layer such as TiN, TaN, or WN. The metal layer 145b may be formed on the barrier layer 145a. The metal layer 145b may include, for example, tungsten (W). In an embodiment, the metal layer 145b may completely fill the intermediate recess regions RR2 in which the barrier layer 145a is formed. In contrast, the metal layer 145b may not completely fill the lowermost and uppermost recess regions RR1 and RR3 in each of which the barrier layer 145a is formed.

A mask layer 149 may be formed in the trenches T. The mask layer 149 may be formed on the gate electrode layer 145. The mask layer 149 may fill the trenches T, the lowermost recess region RR1, and the uppermost recess region RR3. As the intermediate recess regions RR2 are completely filed with the gate electrode layer 145, the mask layer 149 may not be provided in the intermediate recess regions RR2. The mask layer 149 may include a material having an etch selectivity to the metal layer 145b. The mask layer 149 may include, for example, an insulating material or a metallic material. The insulating material may include, for example, SiN, $SiO_2$, TiN, AlO, AlN, or $TiO_x$. The metallic material may include, for example, WN, TaN, TiSiN, Co, Ni, Ti, Ta, $WSi_x$, or $TiSi_x$.

Figure 7F:
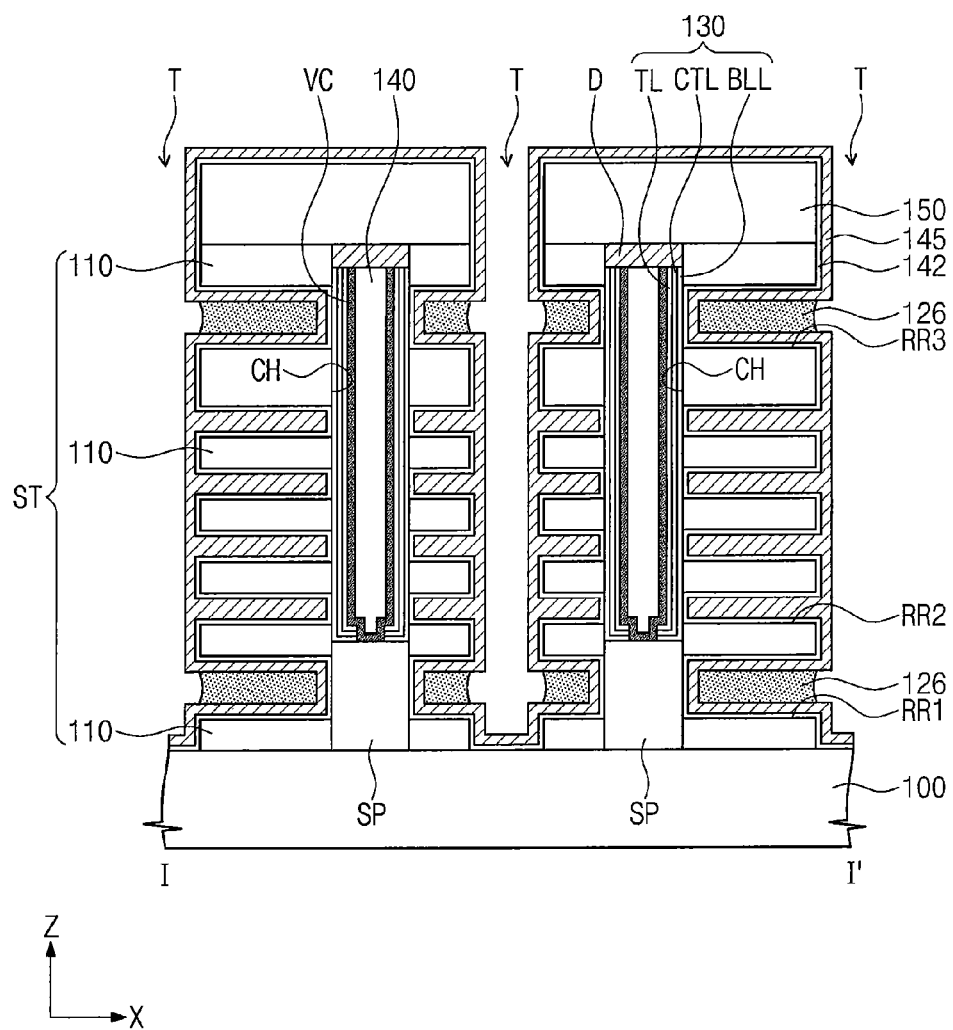

Referring to FIG. 7F, an etching process may be performed on the mask layer 149 formed in the trenches T. Accordingly, mask patterns 126 may be locally formed in the lowermost and uppermost recess regions RR1 and RR3. The mask patterns 126 may expose the gate electrode layer 145 formed on sidewalls and bottom surfaces of the trenches T and also expose the gate electrode layer 145 covering the top surface of the first interlayer dielectric layer 150. Each of the mask patterns 126 may partially cover the gate electrode layer 145 formed in the lowermost and uppermost recess regions RR1 and RR3. A wet etching process may be adopted as the etching process. Therefore, the mask pattern 126 may have a concave sidewall.

Figure 7G:
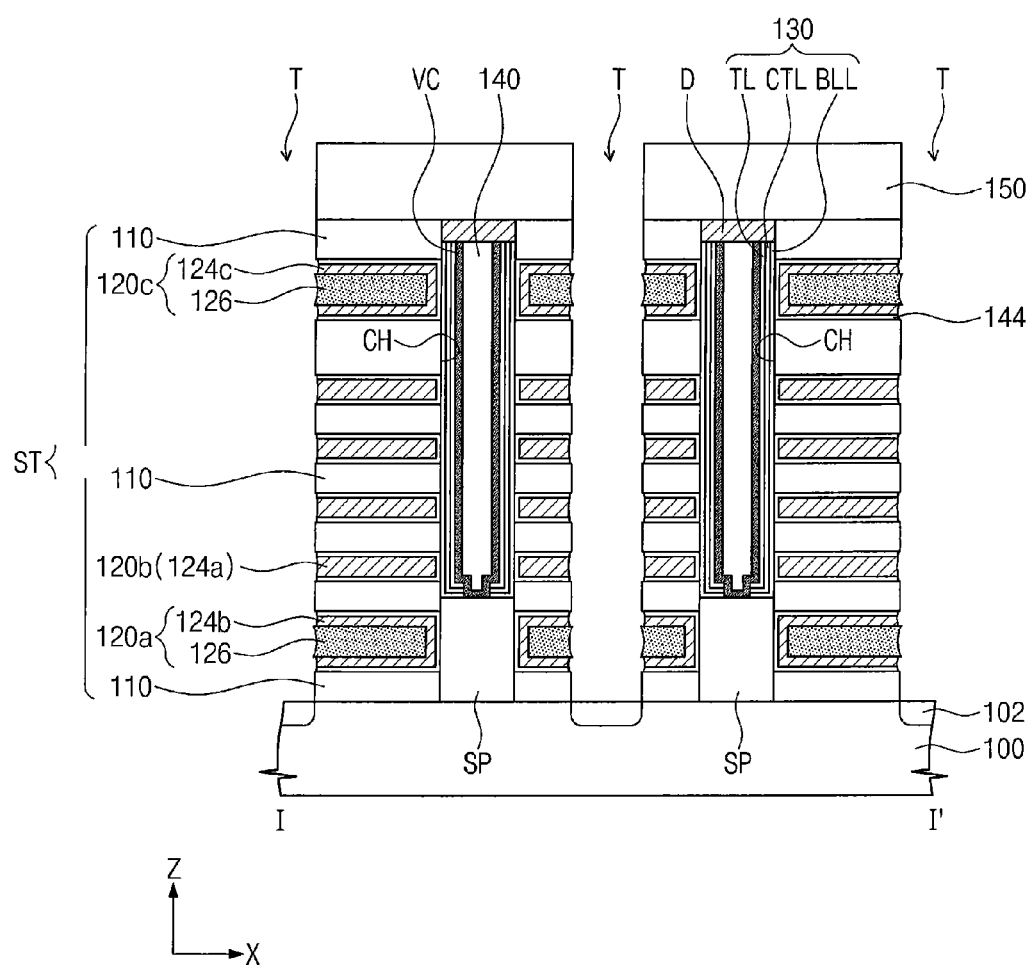

Referring to FIG. 7G, a patterning process may be performed on the gate electrode layer 145 and the horizontal insulation layer 142 that are exposed through the trenches T. Thus, horizontal insulation patterns 144 and gate electrodes 120a, 120b, and 120c may be locally formed in the recess regions RR1, RR2, and RR3. The patterning process may be carried out until exposing the sidewalls of the insulation patterns 110 and the top surface of the substrate 100. The patterning process may be performed such that the horizontal insulation patterns 144 and the gate electrodes 120a, 120b, and 120c may have sidewalls recessed toward the vertical channel VC and the semiconductor pillar SP from the sidewalls of the insulation patterns 110 exposed through the trenches T. The mask patterns 126 may serve as a mask that prevents etching of portions of the gate electrode layer 145 formed in the lowermost and uppermost recess regions RR1 and RR3. As such, the patterning process may not remove but leave portions of the gate electrode layer 145 that are covered with the mask patterns 126.

The gate electrodes 120a, 120b, and 120c may include a ground select gate electrode 120a, cell gate electrodes 120b, and a string select gate electrode 120c. As shown in FIG. 4A, each of the cell gate electrodes 120b may include a barrier pattern 122a and a metal pattern 124a. As shown in FIG. 4B, the ground select gate electrode 120a may include a mask pattern 126, a barrier pattern 122b, and a metal pattern 124b. Likewise, as shown in FIG. 4C, the string select gate electrode 120c may include a mask patterns 126, a barrier pattern 122c, and a metal pattern 124c.

The horizontal insulation patterns 144 may be disposed spaced apart from each other in a third direction Z across the insulation patterns 110. The horizontal insulation pattern 144 formed in the lowermost recess region RR1 may extend onto top and bottom surfaces of the ground select gate electrode 120a from between the semiconductor pillar SP and the ground select gate electrode 120a. The horizontal insulation pattern 144 formed in each of the intermediate recess regions RR2 may extend onto top and bottom surfaces of each of the cell gate electrodes 120b from between the charge storage structure 130 and each of the cell gate electrodes 120b. The horizontal insulation pattern 144 formed in the uppermost recess region RR3 may extend onto top and bottom surfaces of the string gate electrodes 120c from between the charge storage structure 130 and the string gate electrode 120c.

According to exemplary embodiments of the present inventive concept, the mask patterns 126 may be formed in the lowermost and uppermost recess regions RR1 and RR3 to cover the metal layer 145b formed in the lowermost and uppermost recess regions RR1 and RR3. During patterning of the gate electrode layer 145, the mask patterns 126 may prevent etching of the metal layer 145b, formed in the lowermost and uppermost recess regions RR1 and RR3, having a thickness the same as that of the metal layer 145b covering the sidewalls of the insulation patterns 110 and less than that of the metal layer 145b formed in the intermediate recess regions RR2. It thus may be possible to prevent the horizontal insulation patterns 114 and/or the barrier patterns 122b and 122c from being exposed or damaged caused by etching the metal layer 145b formed in the lowermost and uppermost recess regions RR1 and RR3.

Impurity regions 102 may be formed in the substrate 100 exposed through the trenches T. The impurity regions 102 may be formed by an ion implantation process. The impurity regions 102 may have conductivity different from that of the substrate 100.

Figure 7H:
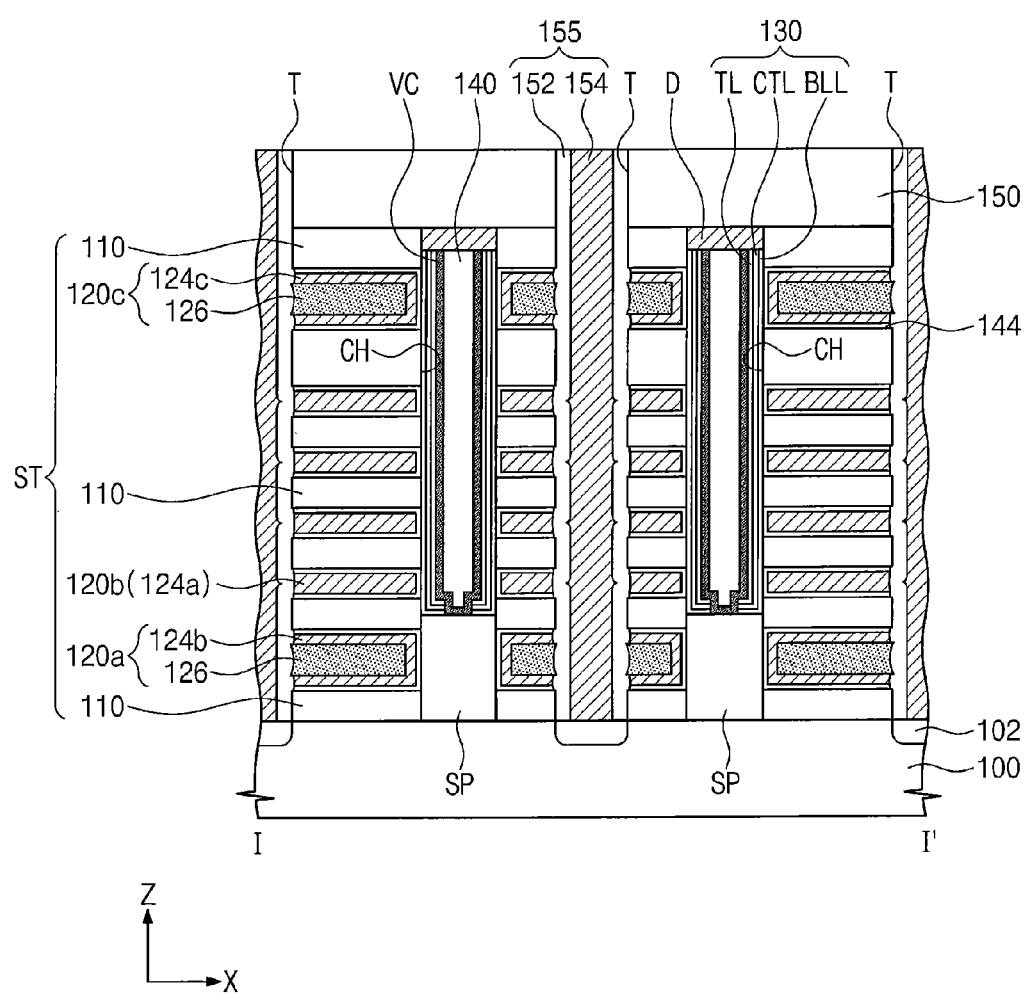

Referring to FIG. 7H, a contact structure 155 may be formed in each of the trenches T. The contact structure 155 may include a spacer 152 and a common source contact 154. The spacer 152 may cover the sidewall of the trench T. For example, the formation of the spacer 152 may include forming an insulation layer to cover the sidewall and the bottom surface of the trench T and then etching a portion of the insulation layer covering the bottom surface of the trench T. For example, the spacer 152 may fill an empty space between the insulation patterns 110 that is formed when the sidewalls of the gate electrodes 120a, 120b, and 120c are recessed. The common source contact 154 may be formed by filling a remaining space of the trench T. The common source contact 154 may be formed by performing, for example, a chemical vapor deposition (CVD), a physical vapor deposition (PVD), or an atomic layer deposition (ALD). The common source contact 154 may include at least one of, for example, metal (e.g., tungsten, copper, or aluminum), conductive metal nitride (e.g., titanium nitride or tantalum nitride), or transitional metal (e.g., titanium or tantalum).

Referring back to FIGS. 2 and 3, a second interlayer dielectric layer 160 may be formed on the first interlayer dielectric layer 150. The second interlayer dielectric layer 160 may cover a top surface of the contact structure 155. The second interlayer dielectric layer 160 may include, for example, a silicon oxide layer.

A bit line contact plug 162 may be formed on the pad D. The bit line contact plug 162 may penetrate the first and second interlayer dielectric layers 150 and 160 to electrically connect with the pad D. The bit line contact plug 162 may include, for example, a metal layer or a metal silicide layer.

A bit line BL may be formed on the second interlayer dielectric layer 160. The bit line BL may be electrically connected to the bit line contact plug 162. As shown in FIG. 2, the bit line BL may extend in the first direction X and run across the stack structures ST.

According to exemplary embodiments of the present inventive concept, in order to form the ground select line having a width greater than those of the word lines, the mask pattern having an etch selectivity to the metal layer may be formed in the lowermost recess region that is not completely filled with the metal layer. The mask pattern may cover a portion of the metal layer formed in the lowermost recess region, so that the portion of the metal layer may not be removed but remain during patterning of the metal layer for forming the gate electrodes. It thus may be possible to prevent the horizontal insulation pattern and/or the barrier pattern from being exposed or damaged caused by etching the metal layer formed in the lowermost recess region.

Although the present invention has been described in connection with the embodiments of the present invention illustrated in the accompanying drawings, it will be understood to those skilled in the art that various changes and modifications may be made without departing from the technical spirit and essential feature of the present invention. It thus should be understood that the above-described embodiments are not limiting but illustrative in all aspects.

What is claimed is:

1. A memory device, comprising:
    a vertical string of nonvolatile memory cells on a substrate; and
    a ground selection transistor extending between said vertical string of nonvolatile memory cells and the substrate, said ground selection transistor having a current carrying terminal electrically coupled to a channel region of a nonvolatile memory cell in said vertical string of nonvolatile memory cells, said ground selection transistor comprising a gate electrode associated with a ground selection line of the memory device and said gate electrode comprising (i) a mask pattern, (ii) a barrier metal layer of a first material extending opposite a sidewall of the mask pattern and (iii) a metal pattern of a second material different from the first material extending between at least a portion of the barrier metal layer and the mask pattern.

2. The memory device of claim 1, wherein said gate electrode of said ground selection transistor is an insulated gate electrode; and wherein the mask pattern comprises a third material different from the second material.

3. The memory device of claim 2, wherein the mask pattern comprises an electrically insulating material.

4. The memory device of claim 2, wherein the mask pattern comprises an electrically conductive material selected from a group consisting of WN, TaN, TiSiN, Co, Ni, Ti, Ta, WSix and TiSix.

5. The memory device of claim 4, wherein the barrier metal layer comprises a metal nitride layer; and wherein the metal pattern comprises tungsten (W).

6. The memory device of claim 5, wherein the barrier metal layer wraps around a sidewall of the metal pattern and extends onto top and bottom surfaces of the metal pattern; and wherein the metal pattern wraps around a sidewall of the mask pattern and extends onto top and bottom surfaces of the mask pattern.

7. The memory device of claim 6, wherein the mask pattern comprises an electrically insulating material.

8. A semiconductor memory device, comprising:
    a stack structure on a substrate, the stack structure including a ground select line and word lines stacked on the ground select line; and
    a vertical channel on the substrate and penetrating the stack structure, wherein the ground select line comprises:
a first mask pattern;
a first barrier pattern extending onto top and bottom surfaces of the first mask pattern from between the vertical channel and the first mask pattern; and
a first metal pattern between the first mask pattern and the first barrier pattern.

9. The semiconductor memory device of claim 8, wherein the first metal pattern comprises a recession recessed toward the vertical channel, the first mask pattern being provided in the recession.

10. The semiconductor memory device of claim 8, wherein the ground select line has a thickness greater than that of each of the word lines.

11. The semiconductor memory device of claim 8, wherein each of the word lines comprises:
a second metal pattern; and
a second barrier pattern extending onto top and bottom surfaces of the second metal pattern from between the vertical channel and the second metal pattern,
the first and second metal patterns having the same material.

12. The semiconductor memory device of claim 8, wherein the first mask pattern comprises a conductive material having an etch selectivity to the first metal pattern.

13. The semiconductor memory device of claim 8, wherein the first mask pattern comprises an insulating material.

14. The semiconductor memory device of claim 8, wherein the first mask pattern has a sidewall exposed through the first barrier pattern, the sidewall of the first mask pattern being concave.

15. The semiconductor memory device of claim 8, wherein
the stack structure further comprises insulation patterns between the ground select line and its adjacent one word line and between the word lines adjacent to each other, and
the semiconductor memory device further comprises a contact structure disposed on the substrate on a side of the stack structure, the contact structure comprising,
a contact plug; and
a spacer between the contact plug and the stack structure,
wherein the ground select line and the word lines have sidewalls recessed toward the vertical channel from sidewalls of the insulation patterns, and
wherein the spacer fills a space between the insulation patterns adjacent to each other.

16. The semiconductor memory device of claim 8, wherein the stack structure further comprises a string select line on the word lines,
wherein the string select line comprises:
a second mask pattern;
a second barrier pattern extending onto top and bottom surfaces of the second mask pattern from between the vertical channel and the second mask pattern; and
a second metal pattern extending onto top and bottom surfaces of the second mask pattern from between the second mask pattern and the second barrier pattern.

17. A semiconductor memory device, comprising:
a stack structure on a substrate, the stack structure including a ground select line and word lines stacked the ground select line; and
a vertical channel on the substrate and penetrating the stack structure,
wherein the ground select line comprises:
a mask pattern; and
a first metal pattern extending onto top and bottom surfaces of the mask pattern from between the vertical channel and the mask pattern,
wherein each of the word lines comprises:
a second metal pattern; and
a barrier pattern extending onto top and bottom surfaces of the second metal pattern from between the vertical channel and the second metal pattern,
wherein the first and second metal patterns have the same material.

18. The semiconductor memory device of claim 17, wherein the mask pattern comprises a conductive material having an etch selectivity to the first metal pattern.

19. The semiconductor memory device of claim 17, wherein the mask pattern comprises an insulating material.

20. The semiconductor memory device of claim 17, wherein the ground select line has a thickness greater than that of each of the word lines.

* * * * *